(12) United States Patent
Cooper et al.

(10) Patent No.: US 6,881,498 B1
(45) Date of Patent: Apr. 19, 2005

(54) SURFACE PROCESS INVOLVING ISOTROPIC SUPERFINISHING

(75) Inventors: Clark VanTine Cooper, Glastonbury, CT (US); Harsh Vinayak, Meriden, CT (US)

(73) Assignee: Sikorsky Aircraft Corporation, Stratford, CT (US)

( * ) Notice: Subject to any disclaimer, the term of this patent is extended or adjusted under 35 U.S.C. 154(b) by 0 days.

(21) Appl. No.: 10/875,977

(22) Filed: Jun. 24, 2004

(51) Int. Cl.[7] .............................. B32B 15/00; C21D 7/04
(52) U.S. Cl. ..................... 428/615; 428/610; 428/621; 428/624; 428/627; 428/650; 428/655; 428/686; 428/687; 428/908.8; 428/938; 148/516; 148/537; 148/902; 427/248.1; 427/299; 427/457; 451/901
(58) Field of Search .................... 428/615, 610, 428/621, 624, 627, 650, 655, 686, 687, 908.8, 938; 148/516, 537, 902; 427/299, 248.1, 457; 451/901

(56) References Cited

U.S. PATENT DOCUMENTS 6,656,293 B1  12/2003  Black et al.

FOREIGN PATENT DOCUMENTS

WO  WO 02/053793 A1  7/2002

OTHER PUBLICATIONS

V. Joshi, K. Suklarni, R.Shivpuri, R.S. Bhattacharya, S.J. Dikshit, D. Bhat; Dissolution and soldering behavior of nitrided hot working steel with multilayer LAFAD PVD coatings, Surface and Coatings Technology 146–147 (2001) 338–343, no month given.

V.H Baggio–Scheid, G. De Vasconcelos, M.A.S. Oliveira, B.C. Ferreira; "Duplex surface treatment of chromium pack diffusion and plasma nitriding of mild steel"; Surface and Coatings Technology 163–164 (2003) 3113–317, no month given.

J.C.A. Batista, C. Godoy, A. Matthews, "Impact testing of duplex and non–duplex (Ti,Al)N and Cr–N PVD coatings", Surface and Coatings Technology 163–164 (2003) 353–361, no month given.

N. Dingremont, E. Bergmann, M. Hans, P. Colllignon, "Comparison of the corrosion resistance of different steel grades nitrided, coated and duplex treated", Surface and Coatings Technology 76–77 (1995) 218–224, no month given.

Primary Examiner—Robert R. Koehler
(74) Attorney, Agent, or Firm—Carlson, Gaskey & Olds

(57) ABSTRACT

A surface processing method and power transmission component includes refining a surface region of a metal from a first roughness to a second roughness less than the first roughness. A solid lubricous coating or a hard coating is then deposited on the surface region. The metal has a surface hardness above 50 $R_c$ to reduce the risk that the metal will deform under the coating and leave the coating unsupported. The surface region of the metal may be transformed into a nitrogen-containing compound or solid solution surface region before the surface refining step and deposition of the coating.

19 Claims, 1 Drawing Sheet

SURFACE PROCESS INVOLVING ISOTROPIC SUPERFINISHING

This invention was made with government support under Contract No. 70NANBOH3048 awarded by the National Institute of Standards and Technology. The government therefore has certain rights in this invention.

BACKGROUND OF THE INVENTION

This invention relates to surface processing of power transmission components and, more particularly, to refining a component surface roughness and forming a coating on the refined component surface.

Components such as those in a power transmission often operate in severe wear conditions. Contact among moving components at elevated temperatures may cause wear such as scuffing and scoring of the component surfaces. The wear may have several detrimental effects such as accelerated corrosion and reduced component lifetime. Also, the component surfaces may become rougher over time from scuffing and scoring, causing increased in heat and accelerated wear.

Selected power transmission components may be designed for better wear resistance through surface processing. Conventional surface processing may include refining the component surface, forming a nitride compound on the refined component surface via nitriding, and forming a hard coating over the nitride compound. Conventional nitriding processes form hard nitride compounds on the component surface. The nitrided compound layers may be brittle, friable, and generally delaminate from the component surface because of poor adhesion to the refined component surface. Delamination of the nitrided compound layers may additionally cause delamination of a hard coating that is formed on the nitrided component surface. During operation of the component, the resulting delaminated hard nitrided layer and hard coating particles may undesirably accelerate component wear by scuffing and scoring the component surface.

Accordingly, it is desirable to provide a surface processing method that provides wear resistance by avoiding use of nitride compounds that may cause delamination and poor adhesion of surface processed features.

SUMMARY OF THE INVENTION

The surface processing method and power transmission component according to the present invention includes refining a surface region of a metal or alloy from a first roughness greater than 10 microinches Ra to a second roughness less than 10 microinches Ra. A coating is then deposited on the surface region. The selected coating may be a solid lubricious coating or a hard coating. The metal or alloy has a surface hardness above 50 $R_c$ to reduce the risk that the metal or alloy will deform under the coating and leave the coating unsupported.

In another example, the surface region of the metal or alloy is transformed into a nitrogen-containing solid solution surface region before the surface refining step and deposition of the coating. A nitriding process is used to form the nitrogen-containing compound or solid solution surface regions, the latter by interstitially diffusing nitrogen into the surface region. The nitrogen-containing solid solution surface region includes a gradual transition in nitrogen concentration.

The surface processing method according to the present invention provides wear resistance by avoiding use of nitride compounds that may cause delamination and poor adhesion of surface processed features.

BRIEF DESCRIPTION OF THE DRAWINGS

The various features and advantages of this invention will become apparent to those skilled in the art from the following detailed description of the currently preferred embodiment. The drawings that accompany the detailed description can be briefly described as follows.

DETAILED DESCRIPTION OF THE PREFERRED EMBODIMENT

Figure 1:
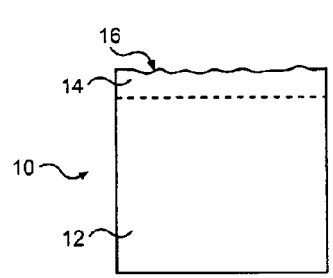
FIG. 1 shows a schematic view of a metal before surface processing.

FIG. 1 shows a schematic view of a metal 10 before surface processing. The metal 10 is an iron-based alloy, however, it is to be understood that aluminum, titanium, nickel, niobium, magnesium or other metals or alloys may benefit from the invention. The metal 10 includes a core 12 and a surface region 14. The surface region 14 has a first surface roughness 16 that is greater than 10 microinches Ra.

Figure 2:
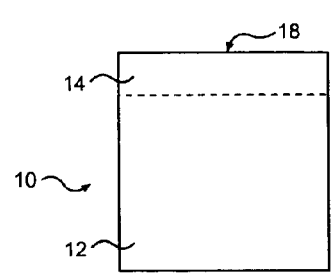
FIG. 2 shows a schematic view of a metal after surface refining.

FIG. 2 shows a schematic view of the metal 10 after a surface refining process. The preferred refining process is a known isotropic superfinishing process which typically results in a non-directional surface texture, although other surface refining methods may be used. Isotropic surface finishing involves scouring the surface region 14, with or without chemical accelerants, using relative movement between a solid media and the surface region 14 to produce a second surface roughness 18 on the metal 10. The second surface roughness is less than 10 microinches Ra and preferably is between 0.25 and 10 microinches Ra.

Figure 3:
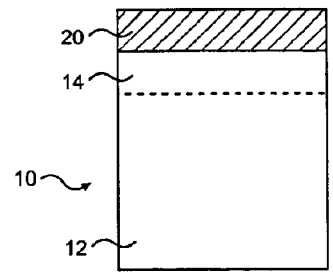
FIG. 3 shows a schematic view of a metal after coating deposition.

FIG. 3 shows a schematic view of the metal 10 after deposition of a coating 20 on the surface region 14. Preferably, the coating is deposited on the surface region 14 by a vapor deposition or magnetron sputtering process. Chemical vapor deposition, physical vapor deposition, and plasma-assisted chemical vapor deposition are preferred vapor deposition processes, however it is to be understood that other or hybrid deposition processes may be utilized.

The selected coating 20 may be a solid lubricious coating or a hard coating, depending on the requirements of the end use or other end user considerations. Preferably, the solid lubricious coating is either an amorphous hydrogenated carbon or a transition-metal chalcogenide. The amorphous hydrogenated carbon coating may include a metal such as titanium or tungsten to alter the characteristics of the coating 20. The preferred transition-metal chalcogenide coatings include $MoS_2$ and $WSe_2$, however additional transition-metal chalcogenide compositions may successfully be used. Preferred hard coatings include TiN and $TiB_2$, although other hard coatings may be utilized.

The metal 10 preferably has a surface hardness above 50 $R_c$. Any of a variety of known methods such as surface-hardening and/or through-hardening of the metal 10 or other hardening method may be used to achieve a hardness above 50 Rc. Conventional methods that leave a residual compound, such as a nitride compound, on the surface region 14 of the metal 10 may lead to coating 20 delamination. Also, if the metal 10 is significantly lower hardness than 50 $R_c$ the metal 10 may deform under the coating 20 and leave the coating 20 unsupported such that the coating 20 may crack.

Figure 4:
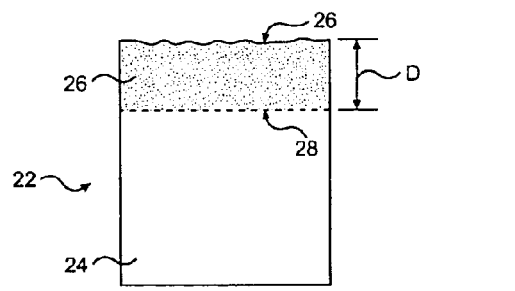
FIG. 4 shows a schematic view of a metal with a nitrogen-containing solid solution surface region before surface refining and coating deposition.

FIG. 4 shows a schematic view of another metal 22 before the surface refining step and deposition of the coating 20. The metal 22 includes a core 24 and a nitrogen-containing compound or solid solution surface region 26. The nitrogen-containing compound or solid solution surface region 26 provides hardness to the metal 22 and preferably the hardness is above 50 $R_c$. The nitrogen-containing compound or solid solution surface region 26 is the result of having transformed a generally nitrogen-free surface region of a metal or alloy, such as the surface region 14 illustrated in FIG. 1.

A nitriding process is used to form the nitrogen-containing compound or solid solution surface region 26. The nitriding process preferably interstitially diffuses nitrogen into the surface region 14 rather than leaving a residual nitride compound on the surface region 14. The interstitial diffusion of nitrogen thereby transforms the surface region 14 into the nitrogen-containing solid solution surface region 26.

Figure 5:
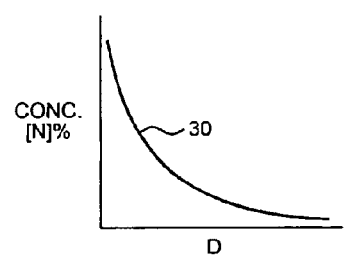
FIG. 5 shows a nitrogen concentration profile over a depth of a nitrogen-containing compound or solid solution surface region.

The nitrogen-containing compound or solid solution surface region 26 includes a gradual transition in nitrogen concentration over a depth D between a surface 28 of the nitrogen-containing compound or solid solution surface region 26 and an inner portion 28 of the nitrogen-containing compound or solid solution surface region 26. As illustrated in FIG. 5, the line 30 represents a gradual nitrogen concentration profile over the depth D. At a shallow depth into the nitrogen-containing compound or solid solution surface region 26 such as near the outer portion 28, the nitrogen concentration is relatively high compared to the nitrogen concentration in the core 24. At a deeper depth, such as near the inner portion 28, the nitrogen concentration is relatively low and, approaches the nitrogen concentration of the core 24. It is to be understood that a variety of nitrogen concentration profiles may be provided.

On one example, metal or alloy first sample coupons were surface processed according to one embodiment of the instant invention and tested side by side with metal or alloy second sample coupons prepared in a conventional surface process. The first and second sample coupons were surface refined to a surface roughness of approximately 2 microinches Ra and then heat treated to a surface hardness of approximately $R_c$ 60. In conformity with conventional surface processing, the second sample coupons were micro-grit blasted to slightly roughen the surface region after surface refining. Subsequently, a magnetron sputtering process deposited a tungsten-containing amorphous hydrogenated carbon coating of thickness between two and three microns on the surface regions of both the first and second sample coupons.

The testing of the coated sample coupons included applying oil conforming to MIL-L-23699 to two of the same coupon samples. The two coupon samples were then rotated against each other under a load. One of the coupon samples was rotated faster than the other and load stress and temperature were measured during the test. Under these conditions, the second coupon samples scuffed or scored under a load stress of 225 ksi and a temperature of 590° F. for the faster-rotating second coupon sample and 460° F. for the slower-rotating second coupon sample. Under the same testing conditions, the first coupon samples scuffed or scored at a load stress of 290 ksi and a temperature of 572° F. for the faster-rotating first coupon sample and 423° F. for the slower-rotating first coupon sample. The second coupon samples, which were surface processed according to the instant invention, endured higher contact stress and higher temperatures before scuffing or scoring than the conventionally prepared second sample coupons.

Although a preferred embodiment of this invention has been disclosed, a worker of ordinary skill in this art would recognize that certain modifications would come within the scope of this invention. For that reason, the following claims should be studied to determine the true scope and content of this invention.

We claim:

1. A surface processing method comprising the steps of:
   (a) refining a surface region of a metal from a first roughness greater than 10 microinches Ra to a second roughness that is less than 10 microinches Ra; and
   (b) depositing a coating on the surface region.

2. The method as recited in claim 1, wherein said step (b) further comprises depositing a transition-metal chalcogenide coating on the surface region.

3. The method as recited in claim 1, wherein said step (b) further comprises depositing an amorphous hydrogenated carbon coating on the surface region.

4. The method as recited in claim 1, wherein said step (b) further comprises depositing a transition metal-containing coating on the surface region.

5. The method as recited in claim 1, wherein said step (b) further comprises depositing the coating by vapor deposition.

6. The method as recited in claim 1, further comprising the step of hardening the surface region to a hardness above $R_c$ 50.

7. A surface processing method comprising the steps of:
   (a) hardening a metal to a surface hardness above $R_c$ 50;
   (b) refining a surface region of the metal from a first roughness to a second roughness that is less than the first roughness; and
   (c) depositing a coating on the surface region.

8. The method as recited in claim 7, wherein said step (a) further comprises hardening the metal by transforming a surface region of the metal into a nitrogen-containing surface region.

9. The method as recited in claim 7, wherein said step (a) further comprises through-hardening the metal.

10. The method as recited in claim 7, wherein said step (b) further comprises refining the surface region to a second roughness less than 10 microinches Ra.

11. The method as recited in claim 7, wherein said step (c) further comprises depositing a transition-metal chalcogenide coating on the surface region.

12. The method as recited in claim 7, wherein said step (c) further comprises depositing an amorphous hydrogenated carbon coating on the surface region.

13. The method as recited in claim 7, wherein said step (c) further comprises depositing a transition metal-containing coating on the surface region.

14. The method as recited in claim 7, wherein said step (c) further comprises depositing the coating by vapor deposition.

15. A power transmission component comprising:
   a metal surface region having a surface roughness less than 10 microinches Ra and a hardness above $R_c$ 50; and
   a coating on said metal surface region.

16. The power transmission component as recited in claim 15, wherein said metal surface region further comprises a metal core and a nitrogen-containing region on said metal core.

17. The power transmission component as recited in claim 15, wherein said coating comprises a transition-metal chalcogenide.

18. The power transmission component as recited in claim 15, wherein said coating comprises a transition metal.

19. The power transmission component as recited in claim 15, wherein said coating comprises amorphous hydrogenated carbon.

* * * * *